(12) United States Patent
Sadovnikov

(10) Patent No.: US 6,528,862 B1
(45) Date of Patent: Mar. 4, 2003

(54) BIPOLAR TRANSISTOR WITH A BOX-TYPE GERMANIUM PROFILE THAT LIES OUTSIDE OF THE EMITTER-BASE DEPLETION REGION

(75) Inventor: Alexei Sadovnikov, Sunnyvale, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/125,897

(22) Filed: Apr. 19, 2002

(51) Int. Cl.$^7$ ............................................. H01L 27/082
(52) U.S. Cl. ....................... 257/565; 257/592; 257/616; 257/655
(58) Field of Search ................................. 257/565, 592, 257/616, 655

(56) References Cited

PUBLICATIONS

P. Deixler et al., "Explorations for High Performance SiGe–Heterojunction Bipolar Transistor Integraton", IEEE BCTM 1.3, 2001, pps. 30–33.

*Primary Examiner*—Mark V. Prenty
(74) *Attorney, Agent, or Firm*—Mark C. Pickering

(57) ABSTRACT

The upper epitaxial layer of a bipolar transistor has a silicon germanium layer and an overlying cap layer. The upper epitaxial layer includes an intrinsic emitter region and a base region. The silicon germanium layer is spaced apart from the intrinsic emitter region, and lies outside of the depletion region associated with the junction between the intrinsic emitter region and the base region.

20 Claims, 3 Drawing Sheets

BIPOLAR TRANSISTOR WITH A BOX-TYPE GERMANIUM PROFILE THAT LIES OUTSIDE OF THE EMITTER-BASE DEPLETION REGION

BACKGROUND OF THE INVENTION

1. Field of the Invention

The present invention relates to a bipolar transistor and, more particularly, to a bipolar transistor with a box-type germanium profile that lies outside of the emitter-base depletion region.

2. Description of the Related Art

A bipolar transistor is a three-terminal device that can, when properly biased, controllably vary the magnitude of the current that flows between two of the terminals. The three terminals include a base terminal, a collector terminal, and an emitter terminal. The charge carriers, which form the current, flow from the emitter terminal to the collector terminal, while variations in the voltage on the base terminal cause the magnitude of the current to vary.

FIG. 1 shows a cross-sectional diagram that illustrates a portion of a prior-art bipolar transistor 100. As shown in FIG. 1, transistor 100 includes an n- epitaxial layer 110 that functions as the collector, shallow trench isolation (STI) regions 112 that are formed in layer 110, and an epitaxial layer 114 that is formed on layer 110 and STI regions 112.

Epitaxial layer 114 includes a p-type doped region 116 that has a lightly-doped region 116A, and a heavily-doped region 116B that is formed below lightly-doped region 116A. Lightly-doped region 116A has a top surface and a bottom region, while heavily-doped region 116B has a top region and a bottom surface. The bottom region of lightly-doped region 116A and the top region of heavily-doped region 116B form a transition region where the dopant concentration increases from the concentration of lightly-doped region 116A to the concentration of heavily-doped region 116B.

Epitaxial layer 114 also includes an n-type doped region 118 that is formed in p-type doped region 116. When unbiased, the physical junction between p-type doped region 116 and n-type doped region 118 forms a depletion region 120 where a junction region of doped region 116A is free of holes and a junction region of doped region 118 is free of electrons. When doped region 116 and doped region 118 are forward biased, a smaller depletion region 120A is formed. (A larger depletion region is formed when the doped region 116 and doped region 118 are reverse biased.)

As further shown in FIG. 1, epitaxial layer 114 includes a silicon germanium (SiGe) layer 114A with a top surface that is positioned to lie within the smaller forward biased depletion region 120A. In addition, the peripheral regions of SiGe layer 114A have a p+ dopant concentration. Epitaxial layer 114 further includes a cap layer 114B that is formed on SiGe layer 114A to have substantially no germanium.

Transistor 100 also includes an n+ polysilicon (poly) region 122 that is formed on cap layer 114B, and an oxide layer 124 that contacts cap layer 114B and poly region 122. Doped region 118 and poly region 122 function as the emitter of transistor 100, while doped region 116 functions as the base.

Transistor 100 additionally includes a nitride layer 126 that contacts oxide layer 124 and poly emitter 122, and a metalization plug 128 that is formed on poly emitter 122. In addition, a base contact 130 is formed on SiGe layer 114A to contact the peripheral p+ region of SiGe layer 114A.

FIG. 2 shows a graph that illustrates a vertical view of epitaxial layer 114 under the central portion of poly region 122. As shown in FIG. 2, n-type doped region 118 of epitaxial layer 114 extends down from the top surface of epitaxial layer 114 to a depth D1. Doped region 118 has an n+ dopant concentration at the surface that decreases to substantially zero at depth D1.

In addition, p-type doped region 116 of epitaxial layer 114 extends down from depth D1 to a depth D2. (Epitaxial layer 114 also includes n-type dopants that outdiffused from the collector that extend from a depth D3 to the bottom surface.) Doped region 116 includes lightly-doped region 116A that lies adjacent to doped region 118, and heavily-doped region 116B that is formed under lightly-doped region 116A.

In addition, as further shown in FIG. 2, SiGe layer 114A has a substantially uniform concentration of germanium (approximately 0.15 mole fraction) throughout layer 114A. A SiGe layer with a substantially constant concentration of germanium is known as having a box-type germanium profile.

A box-type germanium profile has a down ramp 132 that defines a thin top surface layer 134 of SiGe layer 114A that has a decreasing germanium concentration. (The germanium concentration can not go to zero instantly.) Thus, down ramp 132 is substantially linear with a very large slope.

One important measure of a transistor is the amount of base to collector current amplification, known, as beta, provided by the transistor. The germanium in epitaxial layer 114 increases the beta when compared to a standard silicon base layer that has no germanium. This is because SiGe layer 114A has a narrower band gap than the silicon of doped region 118. The difference in band gaps enhances the efficiency of carrier injection from doped region 118 into doped region 116.

To obtain the increased beta, surface layer 134 of SiGe layer 114A must lie within the smaller depletion region 120A when transistor 100 is forward biased. When surface layer 134 of SiGe layer 114A does not lie within depletion region 120A when forward biased, there is substantially no increase in the beta of transistor 100 over what can be obtained with a comparable transistor that does not utilize a silicon germanium base. Thus, if cap layer 114B is too thick and surface layer 134 of SiGe layer 114A does not lie within junction depletion region 120A when forward biased, SiGe layer 114A provides no appreciable increase in beta.

Another important measure of a bipolar transistor is the time required for a minority carrier to pass through the base region, known as the base transit time. This is an important measure for gigahertz frequency devices because the base transit time is one of the major components of the total transit time which, in turn, limits the maximum frequency of the signal.

One component of the base transit time is the boron concentration in doped region 116. As noted above, doped region 116 (the base) has a lightly doped region 116A adjacent to doped region 118 (the emitter) and a heavily doped region 116B adjacent to lightly doped region 116A.

As a result, the boron concentration decreases from a peak value at a depth D4 in heavily doped base region 116B when moving towards doped region 118 (the emitter). This decrease in boron concentration sets up a retarding field that slows electrons injected by the emitter. This results in increased base transit time and, as a result, a decreased fT peak.

One approach to reducing the base transit time is to utilize a SiGe layer with a triangular-type germanium profile. FIG.

3 shows a graph that illustrates a transistor 300 with a triangular-type germanium profile. Transistor 300 is similar to transistor 100 and, as a result, utilizes the same reference numerals to designate the structures that are common to both transistors.

As shown in FIG. 3, transistor 300 differs from transistor 100 in that transistor 300 has a triangular-type germanium profile with a down ramp 310 that extends from the top surface of SiGe layer 314A at depth D1 to a point at depth D5 that corresponds with the location of the peak germanium concentration. As a result, the concentration of germanium linearly increases from zero at the top surface of SiGe layer 314A to approximately 0.15 mole fraction at depth D5 near the bottom surface of SiGe layer 314A with a slope that is much less than the slope of down ramp 132.

In operation, the decreasing-towards-the-emitter slope of the triangular-type germanium profile sets up a uniform field across SiGe layer 314A that is opposite to the retarding field set up by the decreasing-towards-the-emitter slope of the boron dopant concentration. As a result, electrons injected by the emitter (doped region 118) experience a reduced retarding field and, therefore, have a reduced base transit time. However, transistors with triangular-type germanium profiles have a number of disadvantages including being difficult and expensive to fabricate.

In addition to box-type and triangular-type germanium profiles, other types of profiles have also been used. For example, a silicon germanium block with a lower concentration pedestal formed on the block is described by Deixler et al., "Explorations for High Performance SiGe-Heterojunction Bipolar Transistor Integration," IEEE Proc. BCTM 1.3, pp. 30–33, 2001.

The Deixler germanium profile has a number of advantages over a standard box-type germanium profile including improved base current linearity, decreased emitter base capacitance, and increased fT at low current levels. However, the Deixler profile has one significant drawback, that being that the Deixler profile also has a decreasing-towards-the-emitter boron concentration.

As a result, electrons injected by the emitter into the base also experience the retarding field caused by the decreasing-towards-the-emitter boron concentration. This results in increased base transit time and, as a result, a decreased fT peak. Thus, there is a need for alternate structures that can reduce the base transit time of a bipolar transistor.

SUMMARY OF THE INVENTION

The present invention provides a bipolar transistor that has a boxed germanium profile with a reduced transit time. The bipolar transistor of the present invention includes a first epitaxial layer of a first conductivity type, and a second epitaxial layer that contacts the first epitaxial layer.

The second epitaxial layer has a first doped region of the first conductivity type, and a second doped region of a second conductivity type that is formed below the first doped region. The second doped region has a lightly-doped region adjacent to the first doped region, and a heavily-doped region adjacent to the lightly-doped region. The lightly-doped region has a top surface, and the heavily-doped region has a peak dopant concentration at a peak position within the heavily-doped region.

The second epitaxial layer also includes a depletion region between the first doped region and the second doped region, and a silicon germanium (SiGe) region that has a top surface. The top surface of the SiGe region is spaced apart from the depletion region. Further, the transistor of the present invention has a conductive region that is formed to contact the first doped region.

In addition, the top surface of the SiGe region can lie within a range from below the top surface of the lightly-doped region, and to above the peak position. For example, the top surface of the SiGe region can lie in a transition region between the lightly-doped region and the heavily-doped region at a point where the dopant concentration has the largest gradient.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
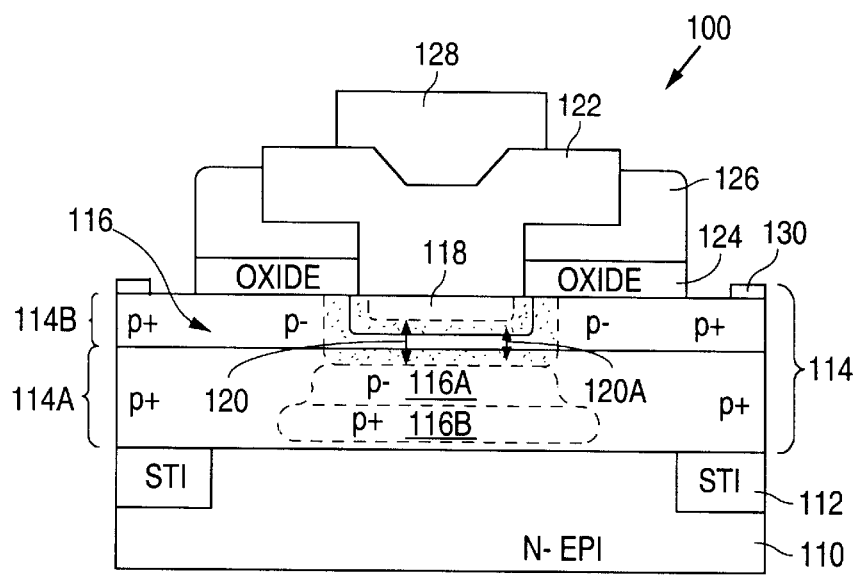
FIG. 1 is a cross-sectional diagram illustrating a portion of a prior art bipolar transistor 100.
Figure 2:
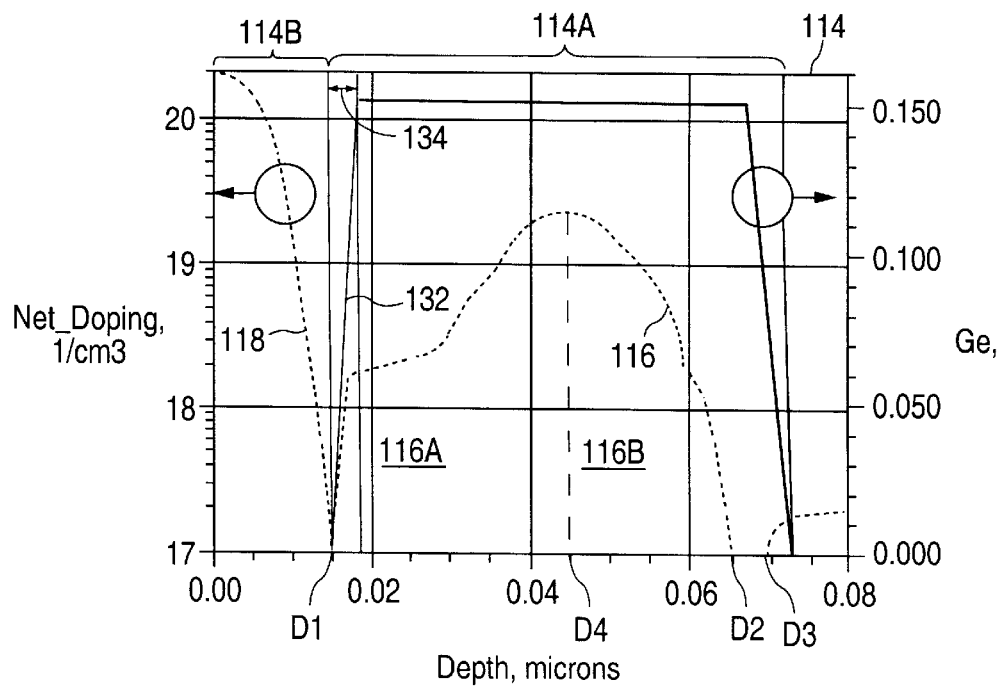
FIG. 2 is a graph illustrating a vertical view of epitaxial layer 114 under the central portion of poly region 122.
Figure 3:
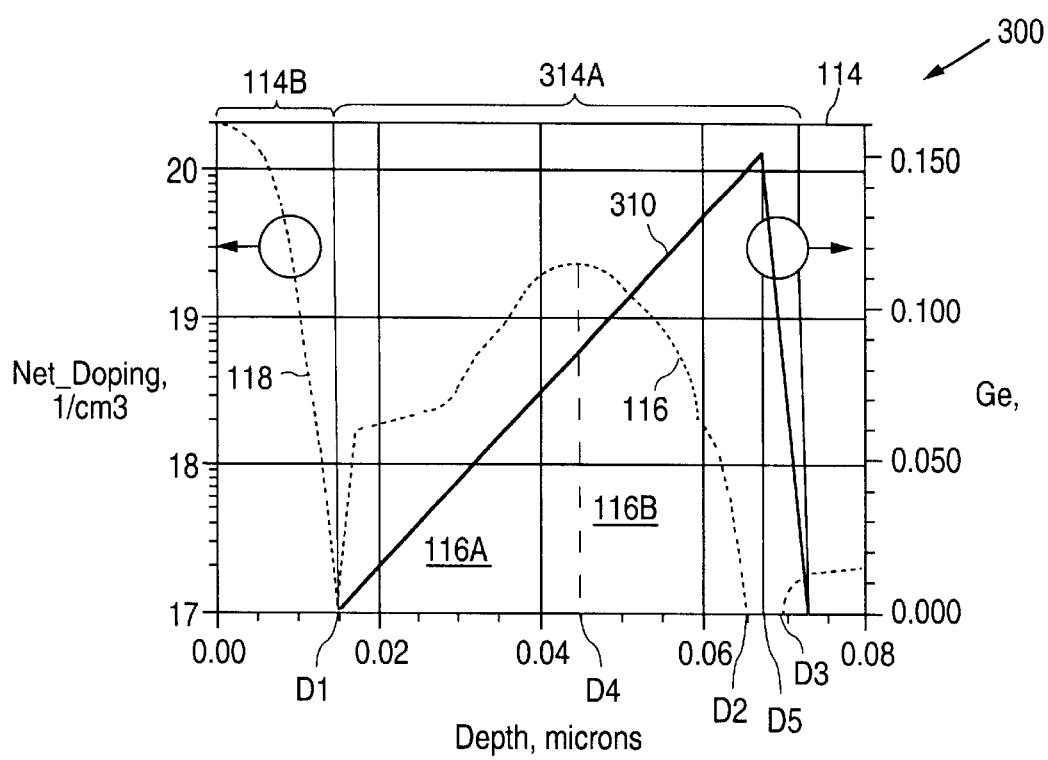
FIG. 3 is a graph illustrating a transistor 300 with a triangular-type germanium profile.
Figure 4:
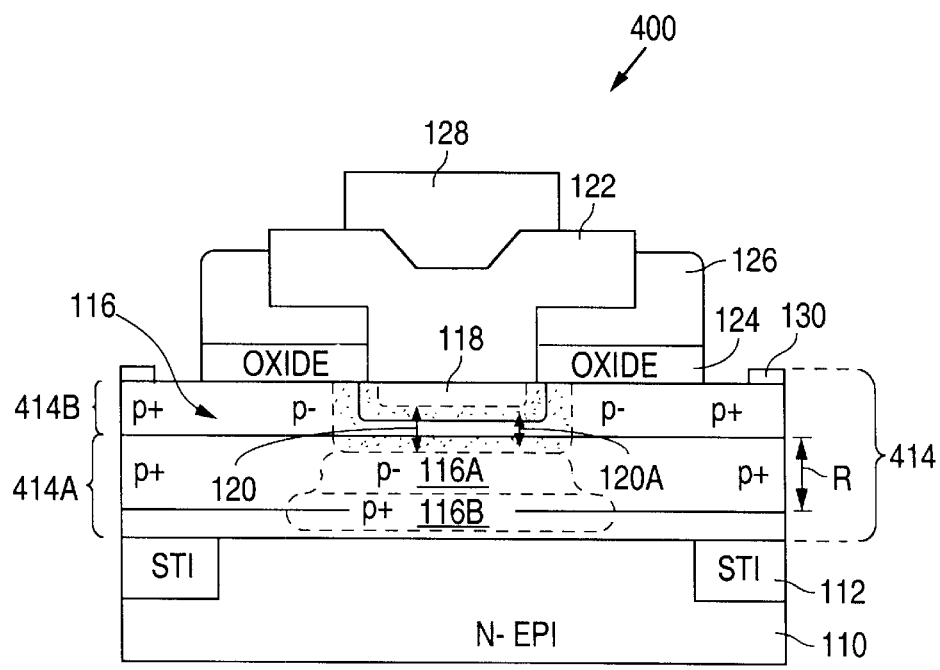
FIG. 4 is a cross-sectional diagram illustrating a portion of a bipolar transistor 400 in accordance with the present invention.

FIG. 4 shows a cross-sectional diagram that illustrates a portion of a bipolar transistor 400 in accordance with the present invention. Transistor 400 is similar to transistor 100 and, as a result, utilizes the same reference numerals to designate the structures that are common to both transistors.

Transistor 400 differs from transistor 100 in that transistor 400 includes an epitaxial layer 414 that has a silicon germanium (SiGe) layer 414A, and a cap layer 414B that is formed on SiGe layer 414A. In accordance with the present invention, SiGe layer 414A is formed outside of junction depletion region 120. (Since layer 414A lies outside of region 120 when no bias is applied, layer 414A must lie outside of region 120A when a forward bias is applied.)

As further shown in FIG. 4, the top surface of SiGe region 414A lies in a region R that ranges from a position below the top surface of lightly-doped region 116A, to a position above the peak dopant concentration in heavily-doped region 116B. For example, the top surface of SiGe region 414A can be located at an intermediate position between the top surface of the lightly-doped surface and the bottom region of lightly-doped region 116A. The intermediate position can be any intermediate position, such as approximately ⅓ or ⅔ of the distance from the top surface of lightly-doped region 116A to the bottom region of lightly-doped region 116A.

Better performance can be obtained when the top surface of SiGe region 414A is positioned in the transition region between lightly-doped region 116A and the heavily-doped region 116B. Best performance can be obtained when the top surface is positioned in the transition region approximately where the dopant concentration has the largest gradient (rate of increase).

Figure 5:
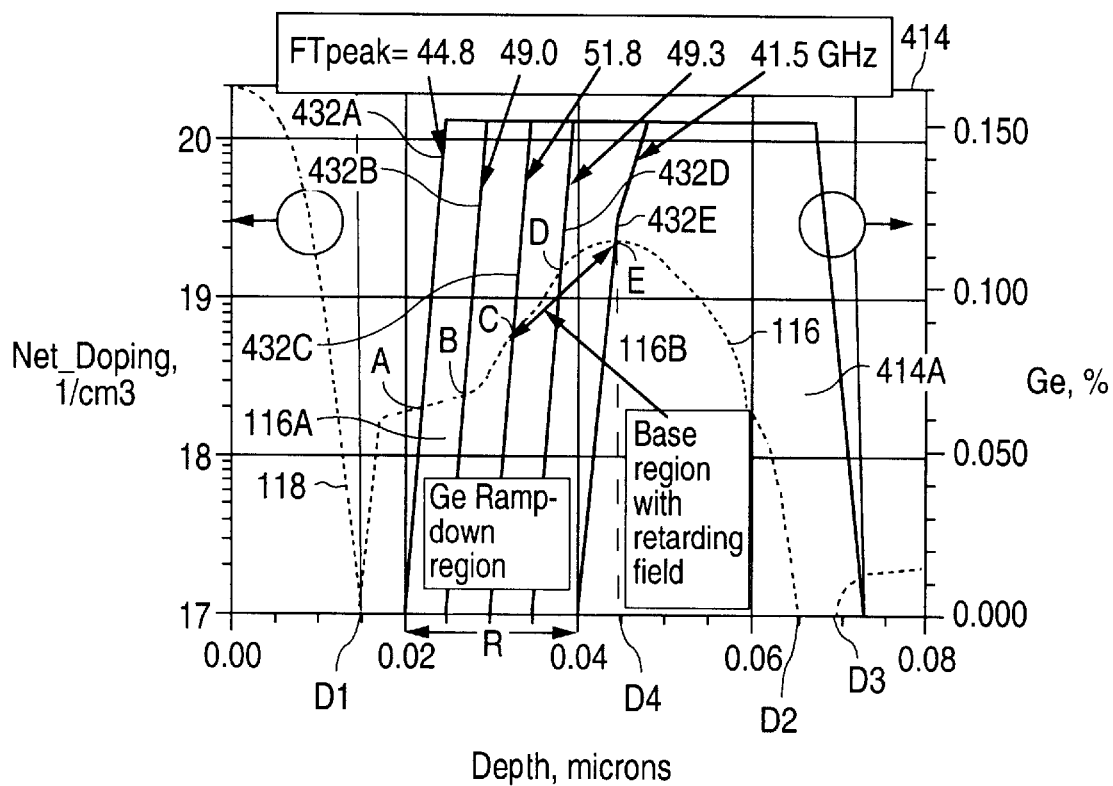
FIG. 5 is a graph further illustrating epitaxial layer 414 in accordance with the present invention.

FIG. 5 shows a graph that further illustrates epitaxial layer 414 in accordance with the present invention. As shown in FIG. 5, SiGe layer 414A has a box-type germanium profile with a number of down ramps 432A, 432B, 432C, 432D, and 432E. Each of the down ramps 432A, 432B, 432C, 432D, and 432E illustrate the different fT peak values that can be obtained by positioning the top surface of SiGe layer 414A at different depths within range R that correspond with different dopant concentrations.

In operation, when a positive bias, such as 1.2V, is placed on collector 110, a positive bias, such as 0.7V is placed on p-type doped region 116, and ground is placed on n-type doped region 118, the base-emitter junction is forward biased.

As a result, n-type doped region 118 injects electrons into base region 116. As the injected electrons transition from lightly-doped region 116A to heavily-doped region 116B, the increased p-type dopant concentration sets up an electric field that retards or slows down the injected electrons.

However, in accordance with the present invention, when the top surface of SiGe layer 414A is positioned within range R below the top surface of lightly-doped region 116A and above the position that corresponds with the peak dopant concentration of heavily-doped region 116B, SiGe layer 414A counteracts the electric field set up by the increasing boron dopant concentration. As a result, the base transit time is reduced, and the fT value (unity gain bandwidth) is increased.

For example, as illustrated with down ramp 432A, when SiGe layer 414A is formed so that the box-type down ramp intersects a point A where the dopant concentration of the second conductivity type corresponds with a position approximately ⅓ of the way below the top surface of lightly-doped region 116A, simulated results indicate that an fT peak of 44.8 GHz can be obtained.

The dopant concentration at point A is substantially greater (an order of magnitude in this example) than the dopant concentration of p-type doped region 116 at depth D1, and substantially less (an order of magnitude in this example) than the peak dopant concentration of heavily-doped region 116B at depth D4.

As illustrated with down ramp 432B, when SiGe layer 414A is formed so that the box-type down ramp intersects a point B where the dopant concentration of the second conductivity type corresponds with a position approximately ⅔ of the way below the top surface of lightly-doped region 116A, simulated results indicate that an fT peak of 49.0 GHz can be obtained.

As further illustrated with down ramp 432C, when SiGe layer 414A is formed so that the box-type down ramp can intersect a point C in the transition region between lightly-doped region 116A and heavily-doped region 116B, where the dopant concentration of the second conductivity type has the largest gradient (rate of increase), simulated results indicate that an fT peak of 51.8 GHz can be obtained.

Similarly, down ramp 432D shows that when the box-type down ramp intersects a point D where the dopant concentration of the second conductivity type corresponds with a position between the transition region and the peak dopant concentration of heavily-doped region 116B, simulated results indicate that an fT peak of 49.3 GHz can be obtained.

In addition, down ramp 432E shows that when the box-type down ramp intersects a point E where the dopant concentration of the second conductivity type corresponds with the position of the peak dopant concentration of heavily-doped region 116B, simulated results indicate that an fT peak of 41.5 GHz can be obtained.

Thus, by positioning SiGe layer 414A so that the top surface of layer 414 is outside of the junction depletion region, and along a line of increasing dopant concentration between the top surface of lightly-doped region 116A and the position that corresponds with the peak concentration in heavily-doped region 116B, the retarding field of the increasing dopant concentration can be counteracted. Thus, the present invention provides the benefits of a triangular-sized germanium profile with the ease of fabricating a box-sized germanium profile.

It should be understood that the above description is an example of the-present invention, and that various alternatives to the invention described herein may be employed in practicing the invention. For example, although the method is described with respect to npn transistors, the method applies equally well to pnp transistors where the conductivity types are reversed. Thus, it is intended that the following claims define the scope of the invention and that methods and structures within the scope of these claims and their equivalents be covered thereby.

What is claimed is:

1. A bipolar transistor comprising:
   a first epitaxial layer of a first conductivity type;
   a second epitaxial layer that contacts the first epitaxial layer, the second epitaxial layer having:
      a first doped region of the first conductivity type,
      a second doped region of a second conductivity type formed below the first doped region, the second doped region having a lightly-doped region adjacent to the first doped region, and a heavily-doped region adjacent to the lightly-doped region, the lightly-doped region having a top surface, the heavily-doped region having a peak dopant concentration at a peak position within the heavily-doped region,
      a depletion region between the first doped region and the second doped region; and
      a silicon germanium (SiGe) region having a top surface, the top surface being spaced apart from the depletion region; and
   a conductive region formed to contact the first doped region.

2. The bipolar transistor of claim 1 wherein the conductive region includes polysilicon.

3. The bipolar transistor of claim 1 wherein the top surface of the SiGe region lies below the top surface of the lightly-doped region.

4. The bipolar transistor of claim 2 wherein the top surface of the SiGe region lies above the peak position.

5. The bipolar transistor of claim 4 wherein
   the lightly-doped region has an intermediate position located between the top surface of the lightly-doped region and a bottom region of the lightly-doped region, and
   the top surface of the SiGe region lies at the intermediate position.

6. The bipolar transistor of claim 5 wherein the intermediate position lies approximately ⅓ of a distance from the top surface of the lightly-doped region to the bottom region of the lightly-doped region.

7. The bipolar transistor of claim 5 wherein the intermediate position lies approximately ⅔ of a distance from the top surface of the lightly-doped region to the bottom region of the lightly-doped region.

8. The bipolar transistor of claim 4 wherein the top surface of the SiGe region lies in a transition region between the lightly-doped region and the heavily-doped region.

9. The bipolar transistor of claim 8 wherein the top surface is positioned in the transition region at a point where the dopant concentration of the second conductivity type has a largest gradient.

10. The bipolar transistor of claim 8 wherein the top surface is positioned in the transition region at a point where the dopant concentration of the second conductivity type has a largest rate of increase.

11. The bipolar transistor of claim 1 wherein the SiGe region has a box-type germanium profile, the box-type germanium profile having a down ramp.

12. The bipolar transistor of claim 4 wherein the SiGe region has a box-type germanium profile, the box-type germanium profile having a down ramp.

13. The bipolar transistor of claim 6 wherein the SiGe region has a box-type germanium profile, the box-type germanium profile having a down ramp.

14. The bipolar transistor of claim 8 wherein the SiGe region has a box-type germanium profile, the box-type germanium profile having a down ramp.

15. The bipolar transistor of claim 14 wherein the top surface is positioned in the transition region so that the down ramp intersects a point where the dopant concentration of the second conductivity type has a largest gradient.

16. The bipolar transistor of claim 14 wherein the top surface is positioned in the transition region so that the down ramp intersects a point where the dopant concentration of the second conductivity type has a largest rate of increase.

17. The bipolar transistor of claim 1 wherein the first doped region and the second doped region are unbiased.

18. The bipolar transistor of claim 12 wherein the first doped region and the second doped region are unbiased.

19. The bipolar transistor of claim 1 wherein the first doped region and the second doped region are forward biased.

20. The bipolar transistor of claim 12 wherein the first doped region and the second doped region are forward biased.

* * * * *